(12) United States Patent
Takahashi et al.

(10) Patent No.: US 6,768,552 B2
(45) Date of Patent: Jul. 27, 2004

(54) THICKNESS MEASURING APPARATUS, THICKNESS MEASURING METHOD, AND WET ETCHING APPARATUS AND WET ETCHING METHOD UTILIZING THEM

(75) Inventors: Teruo Takahashi, Hamamatsu (JP); Motoyuki Watanabe, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 88 days.

(21) Appl. No.: 10/275,136

(22) PCT Filed: Jan. 19, 2001

(86) PCT No.: PCT/JP01/00351
§ 371 (c)(1), (2), (4) Date: Nov. 1, 2002

(87) PCT Pub. No.: WO01/84620
PCT Pub. Date: Nov. 8, 2001

(65) Prior Publication Data
US 2003/0121889 A1 Jul. 3, 2003

(30) Foreign Application Priority Data
May 1, 2000 (JP) ......................................... 2000-132607

(51) Int. Cl.⁷ ............................. G01B 9/02; G01B 11/02
(52) U.S. Cl. ....................... 356/479; 356/481; 356/482; 356/485; 356/503
(58) Field of Search ................................ 356/479, 481, 356/482, 485, 503

(56) References Cited

U.S. PATENT DOCUMENTS

| | | | |
|---|---|---|---|
| 5,220,405 A | 6/1993 | Barbee et al. .............. 356/357 |
| 5,392,124 A | 2/1995 | Barbee et al. .............. 356/381 |
| 5,490,849 A * | 2/1996 | Smith ............................ 606/5 |
| 6,052,478 A * | 4/2000 | Wihl et al. ................... 382/144 |
| 6,160,336 A * | 12/2000 | Baker et al. ................... 310/74 |
| 6,282,309 B1 * | 8/2001 | Emery ........................ 382/145 |
| 6,283,829 B1 * | 9/2001 | Molnar ........................... 451/8 |

FOREIGN PATENT DOCUMENTS

| EP | 0 905 476 A2 | 3/1999 |
|---|---|---|
| JP | 05-248817 | 9/1993 |
| JP | 11-354489 | 12/1999 |

* cited by examiner

*Primary Examiner*—Frank G. Font
*Assistant Examiner*—Khaled Brown
(74) *Attorney, Agent, or Firm*—Morgan, Lewis & Bockius LLP

(57) ABSTRACT

At each measurement time, reflected light from a semiconductor wafer W or the like by measurement light from a measurement light source 11 is coupled to reference light from a reference light generating section 14, and interference light is detected by a photodetector 15. A raw thickness value calculating section 16b selects two light intensity peaks corresponding to the upper and lower surfaces of the wafer W from a light intensity distribution between an interference light intensity and a reference optical path length and calculates a raw thickness value. A statistical thickness value calculating section 16c executes statistical processing including data sorting, determination whether the raw thickness value falls within an allowable numerical value range, and determination of a thickness change line, thereby obtaining a statistical thickness value. With this arrangement, a thickness measuring apparatus and thickness measuring method capable of measuring the thickness of a semiconductor wafer during execution of wet etching independently of the presence of an etchant, and a wet etching apparatus and wet etching method using the thickness measuring apparatus and method are implemented.

18 Claims, 6 Drawing Sheets

THICKNESS MEASURING APPARATUS, THICKNESS MEASURING METHOD, AND WET ETCHING APPARATUS AND WET ETCHING METHOD UTILIZING THEM

TECHNICAL FIELD

The present invention relates to a thickness measuring apparatus and thickness measuring method of measuring the thickness of a semiconductor wafer during execution of wet etching and a wet etching apparatus and wet etching method using the thickness measuring apparatus and method.

BACKGROUND ART

In manufacturing semiconductor devices, recently, the necessity of an etching process for thinning a semiconductor wafer with a pattern or the like is increasing.

In such an etching process, a wet etching apparatus for etching a semiconductor wafer while supplying an etchant is used. In a conventional wet etching method, a dummy wafer is etched to confirm the etching rate in advance, and the etching end time is determined on the basis of the etching rate.

However, when such an etching time management method is used, an extra process for etching a dummy wafer is necessary in addition to an actual etching process. In addition, the etching rate may change for each etching process. For this reason, time management assuming a constant etching rate generates a variation in thickness of resultant semiconductor wafers.

To increase the etching accuracy or operation efficiency in the etching process, the thickness of a semiconductor wafer portion must be measured in situ during etching. With this measurement, data of a change in thickness over time during etching can be obtained whereby the end time can be obtained for each etching process. That is, various etching processes can be managed and controlled.

DISCLOSURE OF INVENTION

Conventional semiconductor wafer thickness measuring apparatuses include a contact thickness meter and Michelson interference thickness meter. Of these thickness meters, the contact thickness meter cannot be applied to measurement in situ. In addition, since this thickness meter comes into contact with a semiconductor wafer, the wafer may be damaged, and therefore, measurement at a high speed is impossible. If a wafer has a holding substrate or film, the thickness of only the wafer cannot be measured.

On the other hand, the Michelson interference thickness meter measures the thickness of a semiconductor wafer in a noncontact state. As such a thickness meter, an apparatus is disclosed in Japanese Patent Application Laid-Open No. H5-248817. This apparatus irradiates a semiconductor wafer with measurement light and measures a change in thickness over time on the basis of a change in reflection timing of reflected light from the wafer surface. In this case, however, only the position on the upper surface is measured. To obtain the thickness, an initial condition of thickness, such as the position on the lower surface, must be given. Additionally, in a wet etching process using an etchant, since measurement light is reflected by the etchant on the wafer surface, the thickness of the semiconductor wafer cannot be measured.

The present invention has been made to solve the above problems, and has as its object to provide a thickness measuring apparatus and thickness measuring method which can measure the thickness of a semiconductor wafer during execution of wet etching, and a wet etching apparatus and wet etching method using the thickness measuring apparatus and method.

In order to achieve the above object, according to the present invention, there is provided a thickness measuring apparatus for measuring a thickness of a semiconductor wafer during execution of wet etching using an etchant, characterized by comprising (1) a measurement light source which supplies measurement light at each of a plurality of measurement times at a predetermined time interval, (2) light branching means for branching the measurement light from the measurement light source, (3) light output means for outputting one component of the measurement light branched by the light branching means to the semiconductor wafer as a measurement object so as to irradiate the semiconductor wafer from a side of an etching surface to which the etchant is being supplied, (4) light input means for inputting reflected light obtained when the measurement light irradiated from the light output means is reflected by the etchant or semiconductor wafer, (5) reference light generating means for passing the other component of the measurement light branched by the light branching means through a reference optical path designed to be able to change an optical path length so as to generate reference light for which a reference optical path length is set, (6) light coupling means for obtaining interference light by coupling the reflected light from the light input means to the reference light from the reference light generating means, (7) photodetection means for detecting the interference light from the light coupling means, (8) raw thickness value calculating means for calculating a raw thickness value of the semiconductor wafer on the basis of an optical path length difference in reference optical path length between two light intensity peaks selected from a plurality of light intensity peaks each having a light intensity more than a set threshold value, using a light intensity distribution representing a correlation between the reference optical path length set by the reference light generating means and a light intensity of the interference light detected by the photodetection means at each of the measurement times, and (9) statistical thickness value calculating means for, at each of the measurement times after an elapse of a specified time from a initial measurement time, determining a thickness change line by linear approximation for a time-rate change in a plurality of valid raw thickness values within a set allowable numerical value range so as to calculate a statistical thickness value from the thickness change line, wherein (10) at the first measurement time after the elapse of the specified time from the initial measurement time, the statistical thickness value calculating means executes, for the time-rate change in valid raw thickness value before the measurement time, data sorting calculation including determination of a thickness change line for sorting by linear approximation, setting of a sorting numerical value range for the thickness change line for sorting, and sorting of data for which the raw thickness value outside the sorting numerical value range is to be invalidated, then determines the thickness change line by linear approximation for the time-rate change in valid raw thickness value after sorting, and sets the allowable numerical value range from the thickness change line.

According to the present invention, there is provided a thickness measuring method of measuring a thickness of a semiconductor wafer during execution of wet etching using an etchant, characterized by comprising (1) the measurement light supply step of supplying measurement light from a measurement light source at each of a plurality of measurement times at a predetermined time interval, (2) the light branching step of branching the measurement light from the measurement light source, (3) the light output step of outputting one component of the measurement light branched in the light branching step to the semiconductor wafer as a measurement object so as to irradiate the semiconductor wafer from a side of an etching surface to which the etchant is being supplied, (4) the light input step of inputting reflected light obtained when the measurement light irradiated in the light output step is reflected by the etchant or semiconductor wafer, (5) the reference light generating step of passing the other component of the measurement light branched in the light branching step through a reference optical path designed to be able to change an optical path length so as to generate reference light for which a reference optical path length is set, (6) the light coupling step of obtaining interference light by coupling the reflected light input in the light input step to the reference light generated in the reference light generating step, (7) the photodetection step of detecting the interference light coupled in the light coupling step, (8) the raw thickness value calculating step of calculating a raw thickness value of the semiconductor wafer on the basis of an optical path length difference in reference optical path length between two light intensity peaks selected from a plurality of light intensity peaks each having a light intensity more than a set threshold value, using a light intensity distribution representing a correlation between the reference optical path length set in the reference light generating step and a light intensity of the interference light detected in the photodetection step at each of the measurement times, and (9) the statistical thickness value calculating step of, at each of the measurement times after an elapse of a specified time from a initial measurement time, determining a thickness change line by linear approximation for a time-rate change in a plurality of valid raw thickness values within a set allowable numerical value range so as to calculate a statistical thickness value from the thickness change line, wherein (10) in the statistical thickness value calculating step, at the first measurement time after the elapse of the specified time from the initial measurement time, (11) for the time-rate change in valid raw thickness value before the measurement time, data sorting calculation including determination of a thickness change line for sorting by linear approximation, setting of a sorting numerical value range for the thickness change line for sorting, and sorting of data for which the raw thickness value outside the sorting numerical value range is to be invalidated is executed, then the thickness change line by linear approximation is determined for the time-rate change in valid raw thickness value after sorting, and the allowable numerical value range from the thickness change line is set.

In the above-described thickness measuring apparatus and thickness measuring method, reflected light obtained when the semiconductor wafer is irradiated with measurement light, and the measurement light is reflected is coupled to reference light that is branched from the measurement light and passes through a predetermined optical path to set a reference optical path length with respect to the optical path length of the reflected light, and the resultant interference light is detected. The thickness of the semiconductor wafer during wet etching is measured from a plurality of light intensity peaks generated in the light intensity distribution of the interference light.

At this time, the measurement light with which the semiconductor wafer is irradiated is reflected by the etchant surface and the upper surface (etching surface) and lower surface of the semiconductor wafer. Light intensity peaks corresponding to the surfaces are obtained in the light intensity distribution. Hence, when two light intensity peaks corresponding to the upper and lower surfaces of the semiconductor wafer, which are selected on the basis of a predetermined selection criterion, are used, the thickness of the semiconductor wafer or a time-rate change in thickness can be measured during wet etching independently of the presence of the etchant. In addition, instead of obtaining the thickness from the reflected light from the wafer upper surface and initial conditions as a reference, reflected light from both the upper and lower surfaces of the wafer is used. For this reason, even when the state of the semiconductor wafer or etchant changes, the thickness of the semiconductor wafer can always be accurately measured.

In thickness measurement after a sufficient number of raw thickness value data are obtained since the elapse of a specified time given in advance, fitting calculation for linearly approximating the time-rate change is executed, and a statistical thickness value is calculated from a resultant thickness change line. For this reason, the influence of a statistical variation in the raw thickness value can be reduced. In thickness measurement, a variation may be generated due to a measurement error when, e.g., the light intensity peak from the etchant surface is not detected, independently of the statistical variation. To cope with this, the raw thickness value to be used to determine the thickness change line is limited to a raw thickness value within a predetermined allowable numerical value range. Raw thickness values with measurement errors can be excluded, and the influence of error variations can be reduced.

When the thickness change line is to be determined for the first time after the elapse of the specified time, statistical processing for raw thickness value data is executed by fitting calculation for data sorting and fitting calculation for determination of the thickness change line. The raw thickness value sorted by statistical processing at the first measurement time after the elapse of the specified time and the determined thickness change line are initial conditions of statistical processing at each of the second and subsequent measurement times.

Hence, after preliminary linear approximation for data sorting is executed, and raw thickness values with measurement errors are invalidated using the thickness change line for sorting and sorting numerical value range and excluded from the statistical processing, statistical processing including linear approximation is executed again to set the thickness change line and allowable numerical value range. With this arrangement, at each measurement time after the elapse of the specified time, the influence of an error variation and the like can be efficiently reduced. Data sorting calculation using the thickness change line for sorting may be executed not once but repeatedly a plurality of number of times to more reliably exclude excess raw thickness value data such as raw thickness values with measurement errors.

According to the wet etching apparatus and method using such a thickness measuring apparatus and method, on the basis of the thickness value obtained for the semiconductor wafer during wet etching, the end of wet etching by stopping supply of the etchant, or change of the etching rate can be appropriately controlled through the etching control means.

BEST MODE OF CARRYING OUT THE INVENTION

A preferred embodiment of a thickness measuring apparatus and thickness measuring method according to the present invention, and a wet etching apparatus and wet etching method using the thickness measuring apparatus and method will be described below with reference to the accompanying drawings. The same reference numerals denote the same elements throughout the description of the drawings, and a repetitive description will be omitted. The dimensional ratios in the drawings do not always match those in the description.

Figure 1:
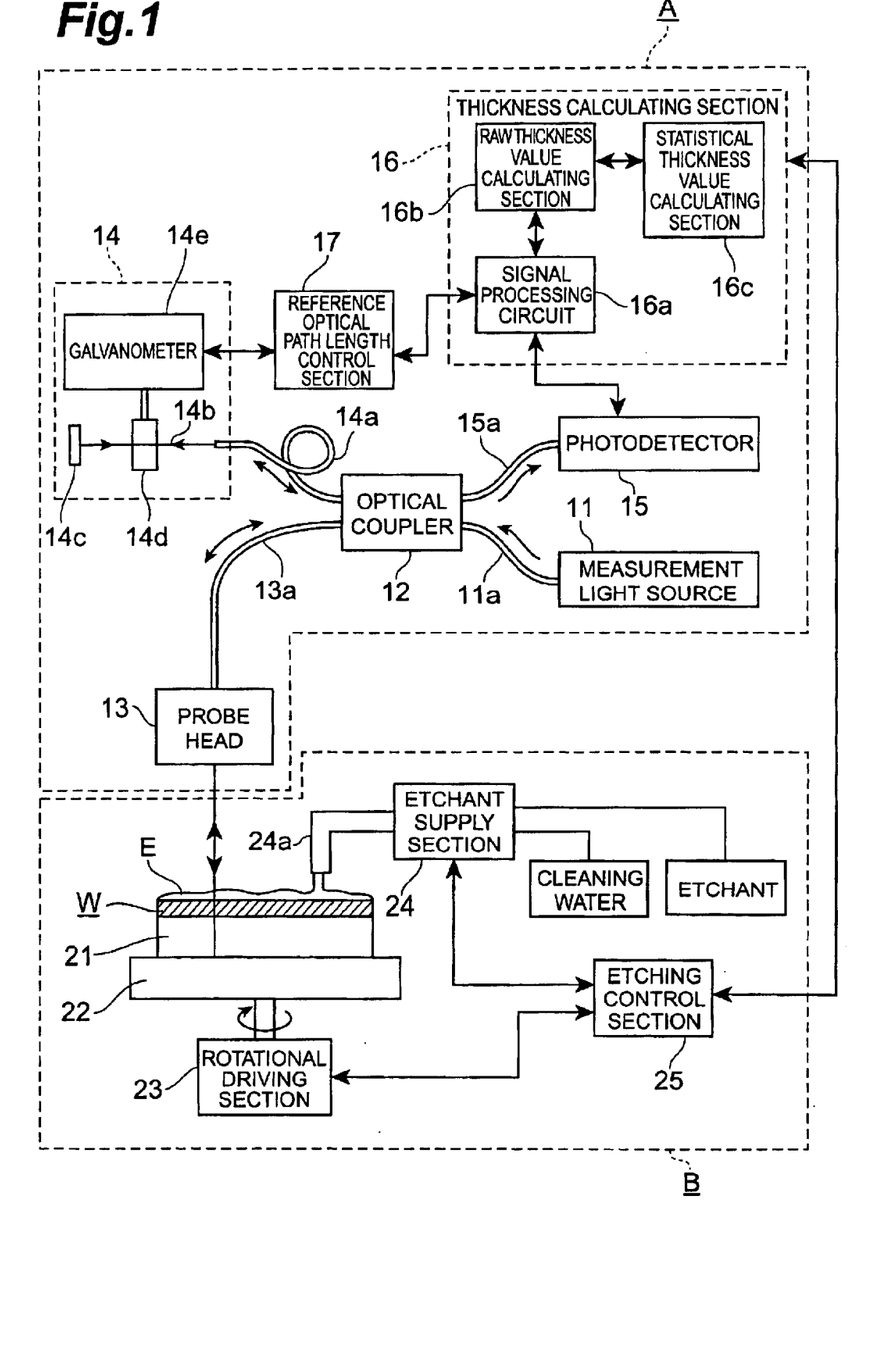
FIG. 1 is a block diagram showing an embodiment of a thickness measuring apparatus and a wet etching apparatus having the thickness measuring apparatus.

First, the arrangements of a thickness measuring apparatus and wet etching apparatus according to the present invention will be described together with steps in a corresponding thickness measuring method. FIG. 1 is a block diagram showing an embodiment of a thickness measuring apparatus and a wet etching apparatus having the thickness measuring apparatus. This wet etching apparatus comprises a thickness measuring apparatus A and a normal wet etching apparatus B except for the thickness measuring apparatus A (this apparatus portion will be simply referred to as a wet etching apparatus B hereinafter).

The thickness measuring apparatus A is a noncontact thickness meter designed to irradiate a semiconductor wafer W to be measured with measurement light and measure the thickness of the semiconductor wafer W using a change in light intensity of interference light between reference light and reflected light from the semiconductor wafer W. Measurement light to be used for thickness measurement is supplied from a measurement light source 11 at each of a plurality of measurement times at a predetermined time interval (measurement light supply step). The measurement light output from the measurement light source 11 is input to an optical coupler 12 formed from a fiber coupler through an input optical fiber 11a. As the measurement light source 11, a low-coherence light source (e.g., an SLD that generates light having a wavelength of 1.3 μm) is preferably used. As the wavelength of measurement light, a wavelength that is sufficiently transmitted through the semiconductor wafer W or an etchant is selected.

The optical coupler 12 functions as a light branching means for branching the measurement light from the measurement light source 11. The measurement light input to the optical coupler 12 is branched to a measurement optical fiber 13a leading to a measurement optical path and a reference optical fiber 14a leading to a reference optical path (light branching step). The branched measurement light components are input to a probe head 13 for measuring the thickness and a reference light generating section 14 for generating reference light, respectively.

The probe head 13 is a light input/output means functioning as a light output means for irradiating the semiconductor wafer W with measurement light and a light input means for inputting again reflected light that is generated when the semiconductor wafer W or an etchant reflects the measurement light. Of the light components branched by the optical coupler 12, the measurement light branched to the optical fiber 13a side is output from the probe head 13 to the semiconductor wafer W. The semiconductor wafer W is irradiated with the measurement light from the etching surface on the upper side (light output step). As this measurement light, light having a wavelength that is sufficiently transmitted through the semiconductor wafer W or the like is used, as described above. Some components of the measurement light are reflected by each interface. The reflected light reaches and is input to the probe head 13 again (light input step). The reflected light that reaches and is re-input to the probe head 13 is input to the optical coupler 12 through the optical fiber 13a.

On the other hand, in the reference light generating section 14, reference light used to measure the thickness (optical path length) as interference light with reflected light from the semiconductor wafer W or the like is generated (reference light generation step). The measurement light branched to the optical fiber 14a side by the optical coupler 12 changes to reference light for which the optical path length of reference light (reference optical path length) with respect to the optical path length of reflected light (reflection optical path length) from the semiconductor wafer W or the like is set through a reference optical path 14b formed from an optical path length modulation optical system arranged between the output terminal of the optical fiber 14a and a reflecting mirror 14c.

In this embodiment, the measurement light output from the output terminal of the optical fiber 14a is transmitted through a parallel-plate glass substrate 14d and reaches and is reflected by the reflecting mirror 14c. Reflected light from the reflecting mirror 14c is transmitted through the glass substrate 14d again in the reverse direction and is input to the optical coupler 12 through the optical fiber 14a as reference light for which an appropriate reference optical path length is set.

The reference light generating section 14 is designed to change the optical path length of the reference optical path 14b. More specifically, the glass substrate 14d on the reference optical path 14b is attached to a galvanometer 14e. The galvanometer 14e operates on the basis of a periodical signal from a reference optical path length control section 17 whereby the tilt of the glass substrate 14d with respect to the reference optical path 14b periodically changes. At this time, the thickness of the glass substrate 14d when viewed from the direction of reference optical path 14b changes. Hence, the optical path length of the reference optical path 14b periodically changes, and the reference optical path length with respect to the reflection optical path length (timing of reference light with respect to reflected light) is periodically scanned.

As described above, the optical coupler 12 serves as a light branching means for branching the measurement light from the measurement light source 11 and also functions as a light coupling means for coupling the reflected light from the probe head 13 to the reference light from the reference light generating section 14. The reflected light that is reflected by the semiconductor wafer W or the like and returns and is input to the probe head 13, and the reference light for which the reference optical path length is set in the reference light generating section 14 are coupled by the optical coupler 12 into interference light (light coupling step). The interference light is input to a photodetector 15 such as a photodiode (PD) through an output optical fiber 15a and detected (photodetection step).

At each of the measurement times, the data and the like of the interference light detected by the photodetector 15 are processed by a thickness calculating section 16. On the basis of these data, the thickness of the semiconductor wafer W is calculated (thickness calculation step).

A detection signal obtained by detecting interference light by the photodetector 15 is input to a raw thickness value calculating section 16b through a signal processing circuit 16a in the thickness calculating section 16. The data of light intensity of the interference light is obtained by the detection signal from the photodetector 15. The angle signal of the galvanometer 14e (glass substrate 14d) from the reference optical path length control section 17 is also input to the raw thickness value calculating section 16b through the signal processing circuit 16a. The data of the reference optical path length or its optical path length change amount in the reference optical path 14b is obtained from the angle signal.

In the raw thickness value calculating section 16b, at each measurement time, a light intensity distribution representing a change (correlation) in light intensity of interference light by the reference optical path length is generated from the light intensity data and reference optical path length data. In the resultant light intensity distribution, a plurality of light intensity peaks are specified as peaks having peak intensities that exceed a threshold intensity. The raw thickness value of the semiconductor wafer W is calculated using two light intensity peaks selected from these light intensity peaks (raw thickness value calculation step).

The raw thickness value calculated by the raw thickness value calculating section 16b is further input to a statistical thickness value calculating section 16c. In the statistical thickness value calculating section 16c, a thickness change line is determined by linear approximation for a time-rate change in a plurality of raw thickness values, and a statistical thickness value is calculated (statistical thickness value calculation step).

Details of reflected light from the semiconductor wafer W or the like, light intensity peaks of a light intensity distribution generated in correspondence with the reflected light, and the method of calculating the raw thickness value and statistical thickness value will be described later.

The wet etching apparatus B is designed to wet-etch one surface (the upper surface in FIG. 1; to be referred to as an etching surface hereinafter) of the semiconductor wafer W as an etching process object (a measurement object of the thickness measuring apparatus A) using an etchant.

The semiconductor wafer W is fixed on a rotary table 22 while being held by a holding substrate 21 formed from a glass substrate arranged on the opposite surface side of the etching surface. The rotary table 22 is rotatably driven by a rotational driving section 23, thereby rotating the semiconductor wafer W during wet etching. When the semiconductor wafer W has a pattern, the surface with the pattern is set on the holding substrate 21 side. Wet etching is performed while setting the surface on the opposite side of the pattern as the etching surface.

Etchant supply to the etching surface of the semiconductor wafer W is done by an etchant supply section 24. The etchant supply section 24 supplies or stops an etchant or supplies cleaning water to the semiconductor wafer W. When an etchant is supplied from a nozzle 24a to the etching surface of the rotating semiconductor wafer W by the etchant supply section 24, the supplied etchant forms a thin etchant layer E on the surface of the semiconductor wafer W. The surface of the semiconductor wafer W is wet-etched by the etchant layer E.

Rotation of the rotary table 22, the holding substrate 21 mounted on the rotary table 22, and the semiconductor wafer W by the rotational driving section 23 and supply/stop of an etchant or cleaning water to the etching surface of the semiconductor wafer W by the etchant supply section 24 are controlled by an etching control section 25.

The probe head 13 of the thickness measuring apparatus A is set at a position opposing a predetermined portion of the etching surface of the semiconductor wafer W placed on the rotary table 22 together with the holding substrate 21 such that the optical path of measurement light with which the etching surface is irradiated becomes almost perpendicular to the etching surface. At this time, reflected light that is generated when the measurement light with which the etching surface is perpendicularly irradiated is reflected by the semiconductor wafer W or the like is efficiently re-input to the probe head 13.

To prevent corrosion of a lens and the like by the scattered etchant, the probe head 13 preferably has, as a protective film, a transparent sheet made of, e.g., polyvinyl chloride that is resistant against the etchant. Alternatively, sticking of the etchant may be prevented by attaching a cylinder to the distal end of the probe head 13 and pressurizing the interior of the cylinder.

A wet etching method for the semiconductor wafer W using the wet etching apparatus shown in FIG. 1, which is formed from the thickness measuring apparatus A and wet etching apparatus B, will be described using an example.

First, the semiconductor wafer W held by the holding substrate 21 is placed on the rotary table 22. Rotational driving of the rotary table 22 is started on the basis of an instruction signal from the etching control section 25. Subsequently, the etchant supply section 24 is instructed to supply an etchant to the etching surface of the semiconductor wafer W, and wet etching of the semiconductor wafer W is started (etching start step).

When wet etching starts, the thickness of the semiconductor wafer W is measured by the above-described thickness measuring apparatus A and thickness measuring method (thickness measurement step). Thickness measurement is executed at a measurement time instructed by the operator or automatically executed at measurement times at a preset time interval. The raw thickness value calculating section 16b calculates the raw thickness value from thickness data acquired at each measurement time. In thickness measurement after a specified time has elapsed, and thickness measurement has been executed a sufficient number of times, the statistical thickness value calculating section 16c calculates a thickness change line representing a change in thickness over time and a statistical thickness value obtained by statistical processing by using the raw thickness values acquired at measurement times.

The thickness of the semiconductor wafer W in the wet etching process in progress and the change in thickness over time are evaluated from the thickness change line and statistical thickness value. Thickness evaluation can be automatically done by, e.g., the thickness calculating section 16 of the thickness measuring apparatus A. Alternatively, a display device may be connected to the thickness calculating section 16 to display the thickness data on the display device and cause the operator to do evaluation on the basis of the displayed data.

At the wet etching end time, supply of the etchant by the etchant supply section 24 is stopped by an instruction signal from the etching control section 25. Subsequently, cleaning water is supplied to the etching surface of the semiconductor wafer W to clean the semiconductor wafer W for a predetermined time. Supply of cleaning water is stopped. After cleaning of the semiconductor wafer W is ended, the rotary table 22 is rotated for a predetermined time to remove the cleaning water from the etching surface of the semiconductor wafer W. When removal of the cleaning water is ended, rotation of the rotary table 22 by the rotational driving section 23 is stopped, thus ending all processes of wet etching of the semiconductor wafer W (etching end step).

At this time, the wet etching end time may be determined on the basis of etching time or etching rate data given in advance. However, the end time at which a set terminal thickness is obtained is preferably calculated from a thickness change line obtained for the data of raw thickness values measured by the thickness measuring apparatus A (end time calculation step).

For calculation of the end time, the end time may be automatically obtained by the statistical thickness value calculating section 16c or determined by the operator from data displayed on the display device. When the end time is obtained by the statistical thickness value calculating section 16c, an end instruction signal for instructing the end time may be output from the statistical thickness value calculating section 16c of the thickness calculating section 16, and the etching control section 25 may control the end of wet etching on the basis of the end instruction signal.

Figure 2A:
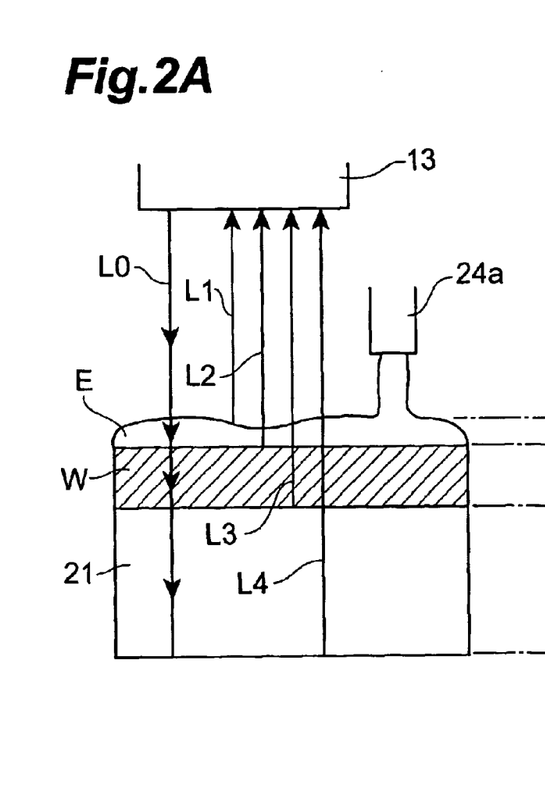
FIGS. 2A and 2B are schematic views showing a method of measuring the thickness of a semiconductor wafer in the wet etching apparatus shown in FIG. 1.
Figure 2B:
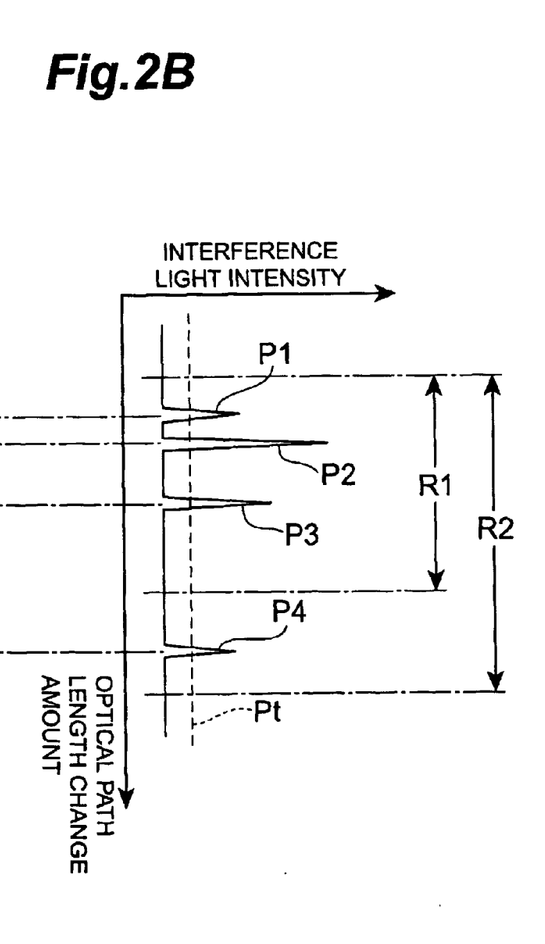

The method of measuring and calculating the raw thickness value of the semiconductor wafer W at each measurement time by the thickness measuring apparatus A and thickness measuring method of the above-described embodiment will be described. FIGS. 2A and 2B are views schematically showing the method of measuring the thickness of the semiconductor wafer W in the wet etching apparatus shown in FIG. 1. FIG. 2A is a side sectional view showing irradiation of the semiconductor wafer W with measurement light and re-input of reflected light to the probe head 13. FIG. 2B is a graph showing the light intensity distribution of interference light obtained by the photodetector 15. Referring to FIG. 2A, the position of the optical path of measurement light with which the semiconductor wafer W is irradiated is shifted from the position of the optical path of reflected light to the probe head 13, for the illustrative convenience.

Measurement light L0 branched by the optical coupler 12 and output from the probe head 13 is sequentially transmitted through the etchant layer E, semiconductor wafer W, and holding substrate 21. Some components of the measurement light L0 are reflected by the interfaces between adjacent layers. More specifically, reflected light L1 returns from the surface of the etchant layer E, reflected light L2 returns from the upper surface of the semiconductor wafer W, reflected light L3 returns from the lower surface of the semiconductor wafer W, and reflected light L4 returns from the lower surface of the holding substrate 21. These reflected light components return to and are re-input to the probe head 13.

The re-input reflected light components L1 to L4 pass through different reflection optical path lengths depending on the interfaces that reflect them, as shown in FIG. 2A, so the reflected light components are input from the probe head 13 to the photodetector 15 through the optical coupler 12 at different timings. In the reference light generating section 14, the optical path length of the reference optical path 14b is periodically changed, as described above, and the reference optical path length (timing of reference light with respect to reflected light) is scanned.

At this time, when the optical path lengths from the optical coupler 12 to the interfaces that have reflected the reflected light components L1 to L4 match the optical path length from the optical coupler 12 to the reflecting mirror 14c, reflected light and reference light whose optical path lengths and timings match strengthen each other by interference. Hence, interference light having a high light intensity is detected by the photodetector 15.

FIG. 2B shows a light intensity distribution representing the correlation between the interference light intensity and the reference optical path length (optical path length change amount) obtained by scanning the optical path length in correspondence with the sectional view shown in FIG. 2A. Referring to this graph, one axis represents the optical path length change amount of the scanned reference optical path 14b, and the other axis represents the light intensity of interference light detected by the photodetector 15. The reference optical path length (optical path length change amount) and optical path length difference do not always accurately correspond to the thicknesses of the etchant layer E, semiconductor wafer W, and holding substrate 21 because of the difference in refractive index. However, FIGS. 2A and 2B show the sectional view and graph in correspondence with each other assuming that there is no difference in refractive index for the descriptive convenience.

As shown in this graph, when the optical path length change amount is scanned in a direction in which the optical path length change amount changes from a smaller value to a larger value (the reference optical path length increases), a light intensity peak P1 (liquid surface peak P1) corresponding to the reflected light L1 from the surface of the etchant layer E, a light intensity peak P2 (wafer upper surface peak P2) corresponding to the reflected light L2 from the upper surface (etching surface) of the semiconductor wafer W, a light intensity peak P3 (wafer lower surface peak P3) corresponding to the reflected light L3 from the lower surface of the semiconductor wafer W, and a light intensity peak P4 (substrate lower surface peak P4) corresponding to the reflected light L4 from the lower surface of the holding substrate 21 are sequentially obtained.

These light intensity peaks P1 to P4 are specified by setting an appropriate light intensity threshold value for the light intensity distribution, and excluding excess peaks such as small light intensity peaks by a noise signal. Referring to FIG. 2B, a light intensity Pt is indicated by a dotted line as such a threshold intensity.

The optical path length range in which light intensity peaks are scanned can be set on the basis of the optical path length scan range in the reference optical path 14b of the reference light generating section 14. An optical path length range to be used to specify a light intensity peak may be selected from the scanned optical path length range and set, as needed. Such selection of the optical path length range may be given to the thickness calculating section 16 in advance. Alternatively, the optical path length range may be instructed by causing the operator to select the optical path length range from a light intensity distribution displayed on the display device connected to the thickness calculating section 16 by operating a mouse cursor or the like.

In thickness measurement, a plurality to light intensity peaks are specified by applying the above-described threshold light intensity condition or the optical path length range condition to a resultant light intensity distribution. Two light intensity peaks corresponding to reflected light from the upper and lower surfaces of the wafer are selected from these light intensity peaks on the basis of a predetermined selection criterion.

For the above light intensity peaks P1 to P4, the light intensity ratio or the like varies depending on the state of the semiconductor wafer W or etchant layer E. However, the order of the optical path length change amounts does not change. For example, the state of the etchant layer E changes depending on the manner the etchant supplied from the nozzle 24a flows on the etching surface. At this time, since the angle of the surface of the etchant layer E with respect to the optical path of the measurement light changes, the light intensity of the reflected light L1 that is reflected by the surface of the etchant layer E and reaches the probe head 13 also changes. In addition, the light intensity ratio also changes depending on the material (Si, GaAs, Doped Si, or the like) used as the semiconductor wafer W or the material of the holding substrate 21.

On the other hand, for the optical path length, even when a state such as a light intensity changes, as described above, the order of the optical path lengths of the light intensity peaks P1 to P4 does not change. Hence, when two light intensity peaks are selected from a plurality of resultant light intensity peaks using the order of light intensity peaks or the like as a selection criterion, the light intensity peaks P2 and P3 corresponding to the upper and lower surfaces of the wafer can be selected.

In the light intensity distribution shown in FIG. 2B, the optical path length difference between the second light intensity peak P2 and the third light intensity peak P3 from a smaller reference optical path length corresponds to the optical path length difference from the upper surface to the lower surface of the semiconductor wafer W. Hence, the raw thickness value of the thickness of the semiconductor wafer W can be calculated from the optical path length difference between the two light intensity peaks P2 and P3.

Especially, the thickness of the semiconductor wafer W can be more directly accurately measured by a measuring method using the two light intensity peaks P2 and P3, as described above, instead of measuring an optical path length corresponding to one light intensity peak and its change over time. In addition, thickness measurement when wet etching is in progress, i.e., the etchant flows on the etching surface of the semiconductor wafer W can be executed independently of the presence/absence of the etchant.

The optical path length difference between the light intensity peaks P2 and P3 corresponds to the optical thickness of the semiconductor wafer W. Hence, the final raw thickness value is obtained by dividing the resultant optical path length difference by the refractive index of the semiconductor wafer. As the refractive index value of the semiconductor wafer W used to calculate the raw thickness value, if the refractive index is known, the value is used. The refractive index may be measured in advance using a wafer whose thickness has been measured by another method using a microgauge or microscope, and the measured value is preferably used, as needed.

As a detailed selection criterion used to select the two light intensity peaks P2 and P3 corresponding to the upper and lower surfaces of the wafer, more specifically, some selection methods can be applied. For example, an optical path length range to be used for calculation of a raw thickness value is set to a range R1 or R2 (FIG. 2B), and the second and third light intensity peaks from the upper side are selected. Alternatively, the optical path length range is set to the range R1 (range R2), and the first and second light intensity peaks from the lower side (the second and third light intensity peaks from the lower side) are selected.

For the light intensity peak P4 corresponding to the substrate lower surface, the optical path length may increase due to the thickness of the holding substrate 21 or the like, and the reflected light L4 may not be detected at a sufficient intensity. In this case, to stably specify a light intensity peak, the optical path length range R1 excluding the optical path length rage in which the light intensity peak P4 is detected is preferably set for selection of light intensity peaks. Even when the holding substrate 21 is not used, the optical path length range R1 is set.

With the above arrangement, a noncontact thickness measuring apparatus capable of measuring the thickness of the semiconductor wafer W during execution of wet etching, and a wet etching apparatus and wet etching method having the thickness measuring apparatus are obtained.

The state of the etchant layer E changes as described above, and its thickness also varies over time, like the angle of the surface. Along with this, the optical path length difference between the light intensity peaks P1 and P2 changes. At this time, the peak position of the light intensity peak P1 shifts, and in addition, the optical path length from the probe head 13 to the semiconductor wafer W changes due to the refractive index of the etchant layer E. Hence, the peak positions of the light intensity peaks P2, P3, and the like also shift. Even in this case, since the light intensity distribution corresponding to the lower side (semiconductor wafer W and holding substrate 21) of the upper surface of the semiconductor wafer W shifts by the same amount as a whole, the optical path length difference such as the optical path length difference between the light intensity peaks P2 and P3 is not influenced by the shift in peak position.

When a pattern is formed on the surface opposite to the etching surface of the semiconductor wafer W, if the beam diameter of measurement light is smaller than the pattern, the thickness of each pattern portion is obtained. If the beam diameter is larger than the pattern, an average thickness within the beam range is obtained. In the wet etching apparatus shown in FIG. 1, the semiconductor wafer W is rotating during etching. In this case, an average thickness is measured by thickness measurement.

Statistical processing of the data of the raw thickness value obtained by the above-described thickness measuring method and raw thickness value calculating method will be described. The value of the thickness (raw thickness value) of the semiconductor wafer W, which is calculated by thickness measurement at each of a plurality of measurement times at a predetermined time interval, has value variations by two factors: (1) a statistical variation (statistical variation) and (2) a variation due to a measurement error (error variation). (1) Statistical variation always occurs even in thickness measurement that has been properly executed. This variation in raw thickness value falls within the allowable range as data.

On the other hand, (2) error variation occurs due to, e.g., the following reason. That is, the angle of the surface of the etchant layer E with respect to measurement light changes depending on the manner the etchant flows. Accordingly, the light intensity of the reflected light L1 from the surface of the etchant layer E changes. Especially, when the tilt of the liquid surface increases due to waving on the surface, the angle of the reflected light L1 with respect to the measurement light increases, and the reflected light is not input to the probe head 13.

At this time, in the light intensity distribution shown in FIG. 2B, since the light intensity of the liquid surface peak P1 becomes less than the threshold value Pt, the liquid surface peak P1 is not specified as a light intensity peak. Under some measurement conditions, the wafer upper surface peak P2 and wafer lower surface peak P3 may also not be specified as light intensity peaks.

In this case, the light intensity peaks are erroneously assigned to the surfaces. Hence, an erroneous raw thickness value is calculated. For example, when the second and third light intensity peaks from the upper side are selected within the optical path length range R2, the thickness of the holding substrate 21 is calculated as a raw thickness value, resulting in a measurement error. When the first and second light intensity peaks from the lower side are selected within the optical path length range R1, the thickness of the etchant layer E or the total thickness of the etchant layer E and semiconductor wafer W is calculated as a raw thickness value, resulting in a measurement error. Even when peaks due to noise signals more than the threshold value level Pt are generated between the light intensity peaks P1 to P4, the noise peaks are selected as the above-described light intensity peaks, and an erroneous thickness is obtained.

For a variation in raw thickness value due to a statistical variation and error variation, in the thickness measuring method and wet etching method in the wet etching apparatus shown in FIG. 1, data are selected by using an allowable range of raw thickness value data, and a thickness change line is determined by linear approximation for the selected raw thickness value data, thereby removing or reducing the influence of the variation in value. That is, the influence of error variation is removed by selecting raw thickness value data. In addition, the influence of statistical variation is reduced by linear approximation.

Figure 3:
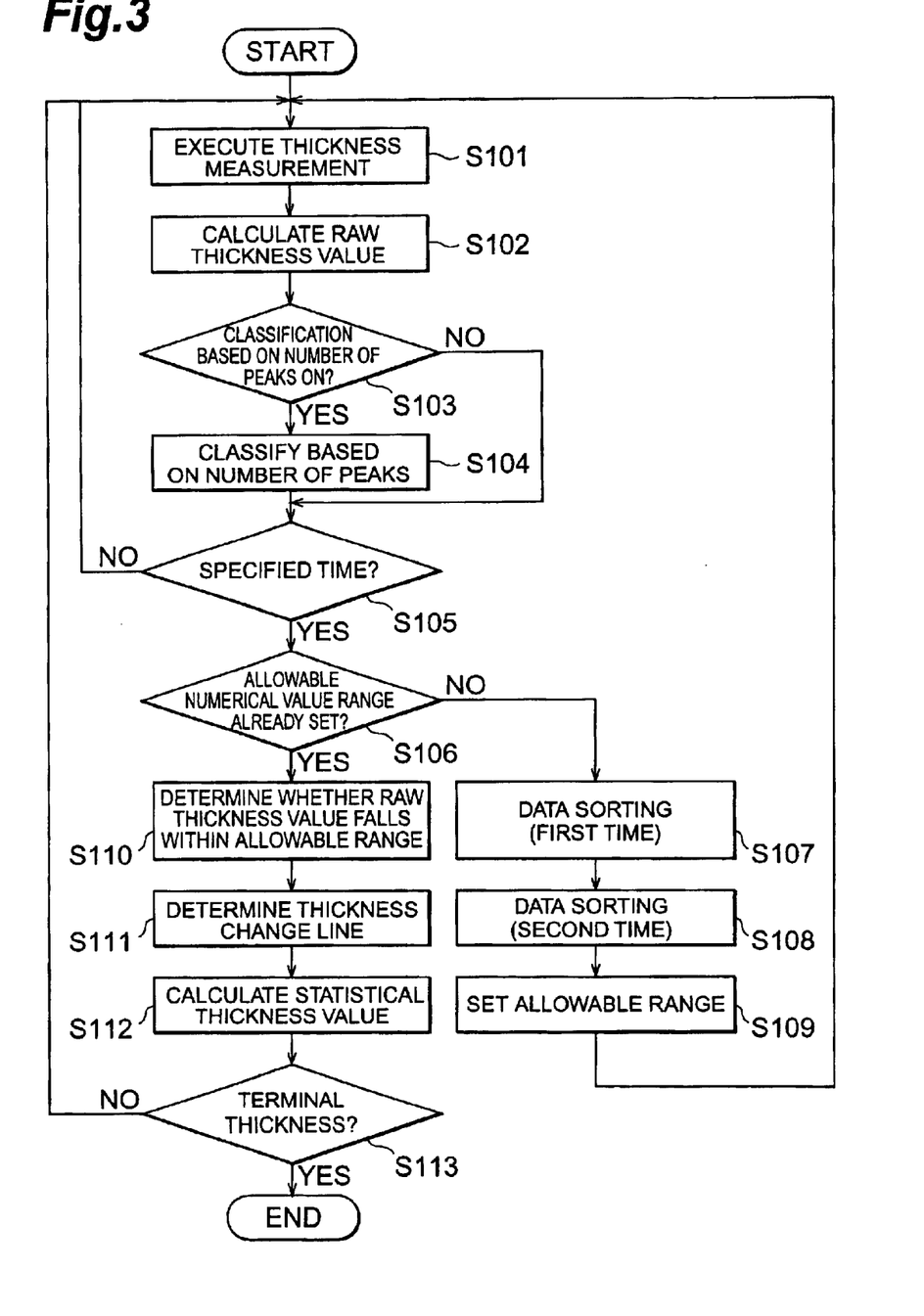
FIG. 3 is a flow chart showing an embodiment of a thickness measuring method and wet etching method.

The method of determining a thickness change line from raw thickness values calculated at the respective measurement times, the statistical thickness value calculating method, and the wet etching end time determining method will be described below in detail. FIG. 3 is a flow chart showing an embodiment of the thickness measuring method and wet etching method in the wet etching apparatus shown in FIG. 1.

In this wet etching apparatus, when wet etching for the semiconductor wafer W is started in the wet etching apparatus B, thickness measurement is executed at each of a plurality of measurement times t at a predetermined time interval (step S101). Preferably, as the time interval that indicates the measurement times, an appropriate time interval, for example, a time interval of 5 Hz for the entire etching time of 1 to 2 min is set in accordance with the etching time or etching rate, and thickness measurement is automatically executed at each measurement time. The time interval may be constant or be changed for the entire etching time.

When measurement light is supplied from the measurement light source 11, and thickness measurement is executed, data from the photodetector 15 and reference optical path length control section 17 are input to the raw thickness value calculating section 16b through the signal processing circuit 16a of the thickness calculating section 16.

Next, the raw thickness value calculating section 16b generates a light intensity distribution (FIGS. 2A and 2B). In addition, using two selected light intensity peaks, a raw thickness value RTh(t) at the measurement time t is calculated (S102). If the number of light intensity peaks specified on the light intensity distribution is smaller than two, no raw thickness value can be calculated. For this reason, RTh(t)=0 µm is set, and the raw thickness value is invalidated.

For the calculated raw thickness value, it is determined whether classification by the number of peaks of specified light intensity peaks is ON (S103). Only if YES in step S103, classification by the number of peaks is done (S104). In this classification by the number of peaks, when for each data of the calculated raw thickness value RTh(t), the number of light intensity peaks specified as peaks each having a light intensity more than the threshold value within the optical path length range set for the light intensity distribution is smaller than three, the raw thickness value is invalidated.

Data when the number of specified peaks is smaller than three corresponds to a case wherein a measurement error has occurred because any one of the light intensity peaks P1, P2, and P3 of the liquid surface peak, wafer upper surface peak, and wafer lower surface peak is not detected. For this data, an erroneous raw thickness value is obtained at high probability. Hence, by executing the classification by the number of peaks, at least some raw thickness values with measurement errors are removed, thereby reducing the influence of the error variation. Such classification by the number of peaks is especially effective when the liquid layer E and wafer W have almost the same thickness, and it is difficult to determine whether a measurement error has occurred by applying a sorting numerical value range or allowable numerical value range (to be described later).

However, if a sufficient effect can be obtained by statistical processing such as data sorting (to be described later) because, e.g., the thickness of the wafer W is much larger than that of the liquid layer E, the classification by the number of peaks is unnecessary. In this case, all raw thickness values except data for which the number of light intensity peaks is smaller than two, and no raw thickness value can be calculated are validated.

Next, it is determined whether the time that has elapsed from the initial measurement time is a specified time or more (S105). If NO in step S105, execution of thickness measurement and calculation of the raw thickness value are repeated. If YES in step S105, statistical processing of the raw thickness value is started. The specified time is used to determine whether the number of statistical points of raw thickness value data sufficient for thickness evaluation of the semiconductor wafer W are obtained. The specified time is preferably designated by the time (time width) elapsed from the initial measurement time. Alternatively, the specified time may be specified by the number of statistical points at which thickness measurement has been executed. In the following description, the specified time is designated not by the number of statistical points but by the time width. A time width Tc from the initial measurement time is defined as the specified time.

If it is determined that the time from the start of thickness measurement has reached the specified time Tc, it is subsequently determined whether the allowable numerical value range for the raw thickness value has already been set (S106). If NO in step S106, it is the first measurement time after the elapse of specified time Tc from the initial measurement time, and therefore, the allowable numerical value range is set.

The above-described allowable numerical value range setting method (S107 to S109) at the first measurement time will be described with reference to the graphs schematically shown in FIGS. 4 to 7. In each of the graphs shown in FIGS. 4 to 9 below, the abscissa represents the etching time t (=measurement time t), and the ordinate represents a thickness Th of the semiconductor wafer W at each time.

In addition, for the raw thickness values RTh(t) calculated at the measurement times t shown in each graph, raw thickness values that are validated at the stages of the graphs are indicated by full circles. Invalid raw thickness values are indicated by open circles or not illustrated for the illustrative convenience. A terminal thickness Th0 of the semiconductor wafer W, which is set in advance as the target of wet etching, is indicated by a dotted line parallel to the abscissa.

Figure 4:
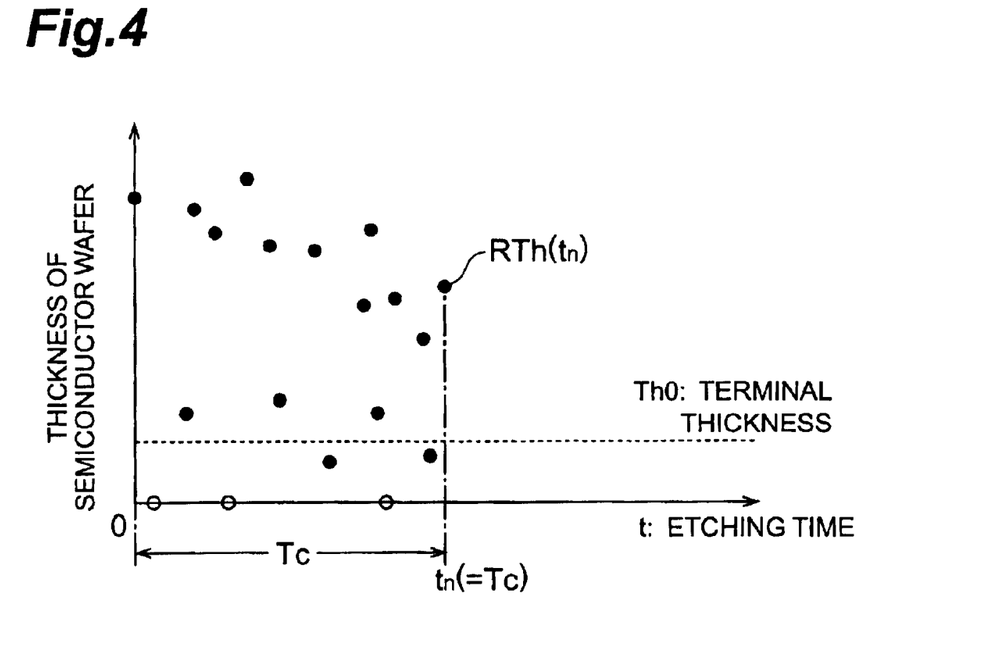
FIG. 4 is a graph schematically showing an example of raw thickness values calculated before a specified time.

FIG. 4 is a graph showing the distribution and time-rate change of raw thickness values measured and calculated until the first measurement time tn for which tn=Tc, i.e., the elapsed time has reached the specified time Tc. Of the raw thickness value data at the respective measurement times, raw thickness values at three data points at which RTh(t)=0 μm are invalidated (open circles) because the number of specified light intensity peaks is smaller than 2. The allowable numerical value range is set using valid data (full circles).

Figure 5:
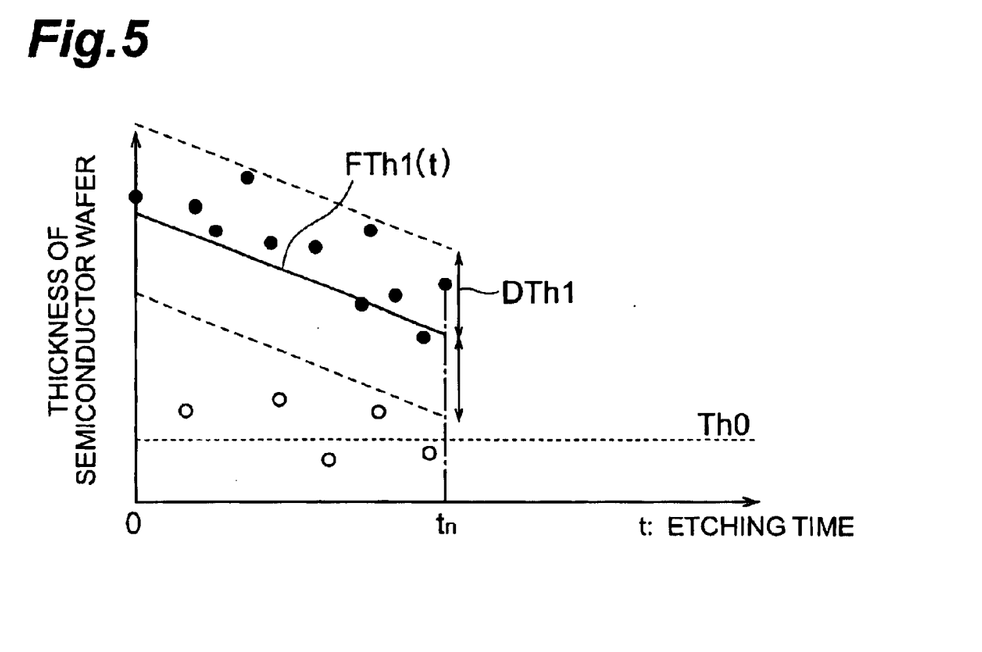
FIG. 5 is a graph showing data sorting calculation of the first time.

Data sorting calculation of the first time is performed for a time-rate change in valid raw thickness values RTh(t) indicated by full circles in FIG. 4 (S107), as shown in FIG. 5. First, linear approximation (fitting calculation such as the least square method) is executed for the data of the raw thickness values RTh(t) to determine a first thickness change line FTh1(t) as an approximated line. The thickness change line FTh1(t) is a line for data sorting.

A first sorting numerical value range DTh1 is set from the thickness change line FTh1(t) for sorting. In this embodiment, a variation value σ1 of the raw thickness value RTh(t) is calculated for the thickness change line FTh1(t). On the other hand, a sorting constant DThc1 for obtaining the sorting numerical value range DTh1 is set in advance. From these numerical values, the sorting numerical value range DTh1 is set as DTh1=σ1×DThc1. As the variation value σ1 of the raw thickness value, for example, the value of standard deviation for the thickness change line for raw thickness value data sorting can be used.

Data sorting of the first time for the raw thickness value is executed using the set sorting numerical value range DTh1. More specifically, raw thickness value data within the range of ±DTh1 from the thickness change line FTh1(t) (indicated by two dashed lines that sandwich the thickness change line FTh1(t) for sorting from the upper and lower sides in FIG. 5) are continuously validated. In addition, raw thickness value data outside this range (five data points indicated by open circles in FIG. 5) are invalidated.

Figure 6:
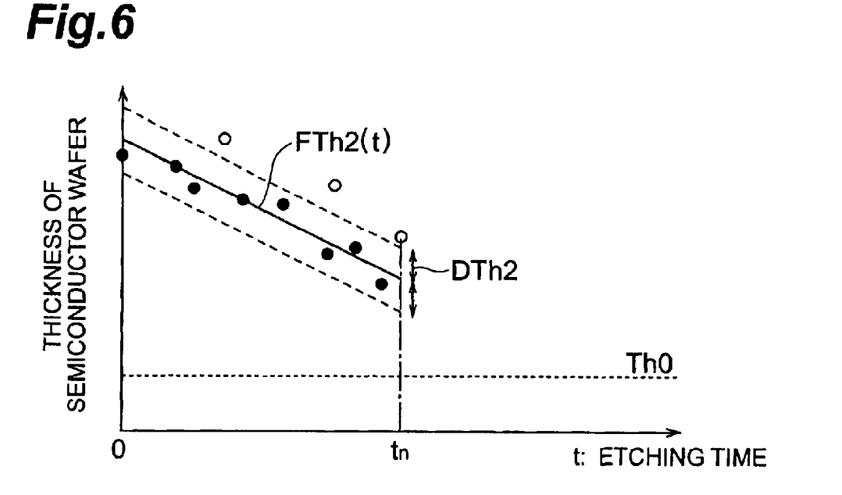
FIG. 6 is a graph showing data sorting calculation of the second time.

Next, data sorting calculation of the second time is executed for a time-rate change in the valid raw thickness values RTh(t) indicated by full circles in FIG. 5, as shown in FIG. 6 (S108). The data sorting calculating method is almost the same as in the first time. That is, linear approximation is executed for the data of the raw thickness value RTh(t), thereby determining a second thickness change line FTh2(t) for sorting as an approximated line.

Subsequently, a sorting numerical value range DTh2 of the second time from the thickness change line FTh2(t) for sorting is set as DTh2=σ2×DThc2 on the basis of a variation value σ2 and sorting constant DThc2. Raw thickness value data within the range of ±DTh2 from the thickness change line FTh2(t) are continuously validated. In addition, raw thickness value data outside this range (three data points indicated by open circles in FIG. 6) are invalidated. Thus, data sorting calculation of raw thickness values of this embodiment is ended.

Figure 7:
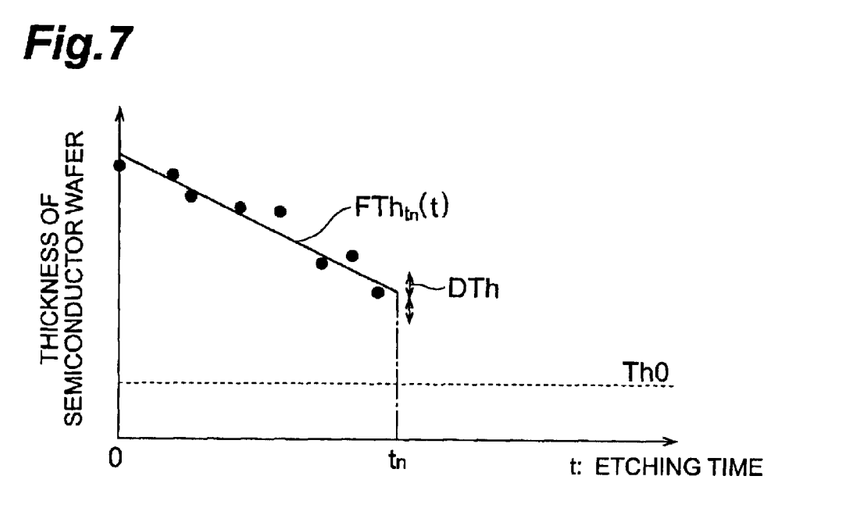
FIG. 7 is a graph showing setting of an allowable numerical value range.

An allowable numerical value range DTh is set on the basis of the time-rate change in data of raw thickness values RTh(t) that are valid after sorting by the above-described data sorting calculation, as shown in FIG. 7 (S109). First, linear approximation calculation is executed for the data of raw thickness values (eight data points indicated by full circles in FIGS. 6 and 7) validated by data sorting calculation of the first and second times, thereby determining a thickness change line $FTh_{tn}(t)$ as an approximated line representing a time-rate change in raw thickness value. The subfix tn of the thickness change line indicates that the thickness change line is determined at the measurement time tn.

The allowable numerical value range DTh from the thickness change line $FTh_{tn}(t)$ is set. The method of setting the allowable numerical value range DTh in this embodiment is almost the same as the method of setting the sorting numerical value ranges DTh1 and DTh2. First, for the thickness change line $FTh_{tn}(t)$, a variation value σ such as the standard deviation of the raw thickness value RTh(t) that is validated at this stage is calculated. On the other hand, an allowance constant DThc to be used to obtain the allowable numerical value range DTh is set in advance. From these numerical values, the allowable numerical value range DTh is set as DTh=σ×DThc.

The allowable numerical value range DTh set here is used to determine whether a raw thickness value at each of measurement times (second and subsequent measurement times after the elapse of the specified time Tc from the initial measurement time) is valid or invalid. When determination of the thickness change line $FTh_{tn}(t)$ at the measurement time tn and setting of the allowable numerical value range DTh are ended, the processing shifts to execution of the next thickness measurement and calculation of the raw thickness value.

At second and subsequent measurement times after the elapse of the specified time Tc from the initial measurement time, the allowable numerical value range has already been set. Hence, the above-described data sorting and (re-)setting of the allowable numerical value range are not executed, and it is determined whether a raw thickness value falls within or outside the allowable range. The method of determining whether a raw thickness value falls within or outside the allowable range at second and subsequent measurement times (S110 to S112) will be described with reference to the graphs schematically shown in FIGS. 8 and 9.

Figure 8:
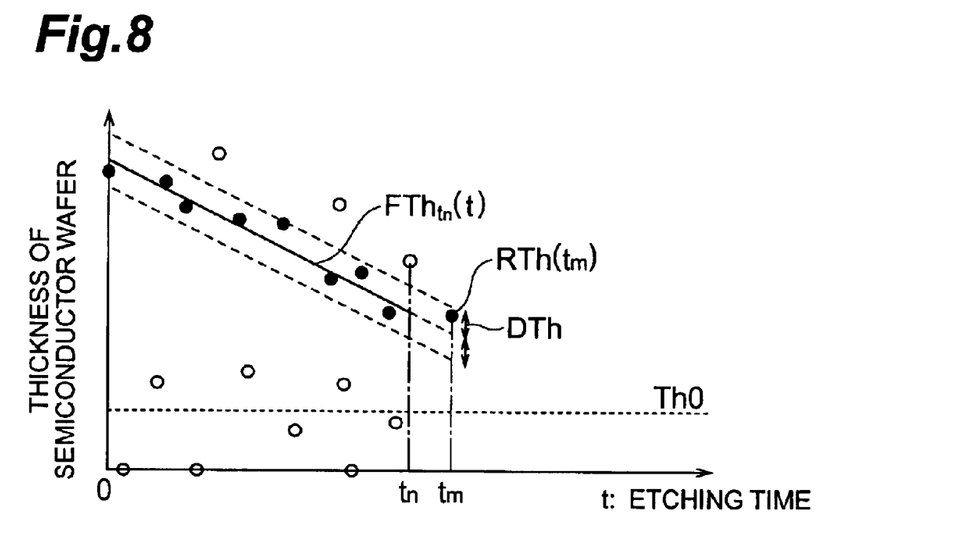
FIG. 8 is a graph showing how whether a raw thickness value falls within or outside the allowable numerical value range is determined.

For the raw thickness value RTh(tm) calculated at the second or subsequent measurement time tm, it is determined whether the value falls within or outside the allowable range (S110), as shown in FIG. 8. More specifically, determination whether the value falls within or outside the allowable range is done by determining whether the value falls within the allowable numerical value range DTh from the thickness change line $FTh_{tn}(t)$ determined at the preceding measurement time (here, the measurement time tn).

That is, the thickness change line $FTh_{tn}(t)$ determined at the preceding measurement time tn is extrapolated (dotted line) to obtain an expected value $FTh_{tn}(tm)$ of the thickness at the current measurement time tm. If the raw thickness value RTh(tm) by thickness measurement executed at the measurement time tm falls within the range of ±DTh from $FTh_{tn}(tm)$ (indicated by two dashed lines that sandwich the thickness change line $FTh_{tn}(t)$ from the upper and lower sides in FIG. 8), the data of the raw thickness value RTh(tm) is validated. Otherwise, the data of the raw thickness value is invalidated. On the basis of the determination result, the thickness change line $FTh_{tm}(t)$ for the current measurement time tm is determined (S111).

Figure 9:
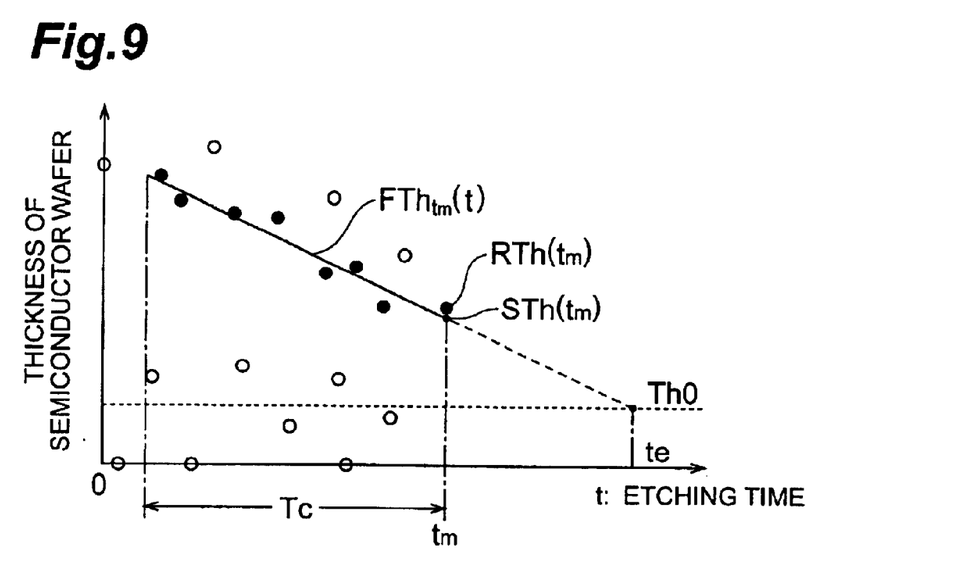
FIG. 9 is a graph showing how a thickness change line is determined and a statistical thickness value is calculated.

In the graph shown in FIG. 8, the raw thickness value RTh(tm) falls within the range of the allowable numerical value range DTh from the preceding thickness change line $FTh_m(t)$. At this time, the raw thickness value RTh(tm) is valid. As shown in FIG. 9, linear approximation calculation is executed for valid raw thickness value data (full circles) within the time range of the specified time Tc from the measurement time tm, including the raw thickness value RTh(tm), thereby determining the new thickness change line $FTh_{tm}(t)$.

On the other hand, if the raw thickness value RTh(tm) falls outside the range of the allowable numerical value range DTh from the preceding thickness change line $FTh_m(t)$, the raw thickness value RTh(tm) is invalid. At this time, linear approximation calculation is not executed. The preceding thickness change line is directly determined as the thickness change line $FTh_{tm}(t)=FTh_m(t)$ at the current measurement time tm.

When the thickness change line $FTh_{tm}(t)$ is determined, a statistical thickness value STh(tm) at the measurement time tm is calculated by $STh(tm)=FTh_{tm}(tm)$ (S112), and the thickness value data statistical processing at the measurement time tm is ended. It is determined whether the calculated statistical thickness value STh(tm) has reached the terminal thickness Th0 (S113). If the statistical thickness value STh(tm) has reached the preset terminal thickness Th0 of wet etching, an end instruction signal is output from the thickness calculating section 16 (statistical thickness value calculating section 16c) to the etching control section 25 to end wet etching. On the other hand, if the statistical thickness value STh(tm) has not reached the terminal thickness Th0, as shown in FIG. 9, the wet etching process is continued, and the next thickness measurement is executed.

In the above-described thickness measuring apparatus and thickness measuring method, and the wet etching apparatus and wet etching method using the thickness measuring apparatus and method, the interference light between reflected light and reference light, which are generated from measurement light, is detected. Light intensity peaks corresponding to the upper and lower surfaces of the semiconductor wafer are specified and selected in a light intensity distribution for a change in optical path length. Raw thickness values are calculated from the difference in optical path length between the light intensity peaks. With this arrangement, the thickness of a semiconductor wafer can be measured during execution of wet etching independently of the presence of an etchant. In addition, since two light intensity peaks from the upper and lower surfaces of the wafer are used, the thickness of the semiconductor wafer can be accurately measured even when the state of the etchant layer changes.

At a measurement time at which a sufficient number of statistical points of raw thickness value data are present after the elapse of the specified time, statistical processing including determination about the allowable numerical value range and determination of a thickness change line by linear approximation is executed. With this arrangement, a statistical thickness value in which the influence of an error variation and statistical variation is sufficiently reduced can be calculated as the thickness of the semiconductor wafer W at that time.

Especially, at the first measurement time after the elapse of the specified time, before determination of the thickness change line, data sorting calculation including preliminary linear approximation calculation for data sorting, setting of a sorting numerical value range, and data sorting is executed. After that, the thickness change line is set, and the allowable numerical value range is set on the basis of valid raw thickness values after the end of data sorting calculation. With this processing, the thickness of the semiconductor wafer W can be more accurately obtained by sufficiently and efficiently removing the influence of an error variation and the like from the thickness change line and statistical thickness value. In addition, at the second and subsequent measurement times, determination is done for each raw thickness value on the basis of the set allowable numerical value range and the preceding thickness change line. Only when a raw thickness value is validated, new linear approximation calculation is executed, thereby realizing efficient calculation of a statistical thickness value.

The allowable numerical value range and sorting numerical value range at the first measurement time after the elapse of the specified time are set on the basis of a variation value from the thickness change line of a raw thickness value that is valid at that time and the allowance constant and sorting constant, which are determined in advance. Since the actual state of raw thickness value data as an object is reflected in setting the allowable numerical value range and sorting numerical value range, a numerical value range appropriate for the data can be set.

The variation in raw thickness value data decreases every time data sorting is executed. For this reason, the allowable numerical value range is normally set to a numerical value range smaller than the sorting numerical value range. More specifically, in the above-described example, the first sorting numerical value range DTh1, second sorting numerical value range DTh2, and allowable numerical value range DTh normally have a relationship DTh1>DTh2>DTh. However, since the relationship between the numerical value ranges is mainly determined by the variation value, the allowance constant and sorting constant from which the variation value has been removed do not always have such a relationship.

For the allowable numerical value range and sorting numerical value range, when the variation value of data is predicted in advance, the operator or the like may directly set the numerical value ranges without designating the allowance constant and sorting constant. Even in this case, the numerical value ranges are preferably set to satisfy the above relationship. Some numerical value ranges (e.g., the second sorting numerical value range and final allowable numerical value range) may be set equal, or the allowable numerical value range may be set to be slightly wider than the sorting numerical value range, as needed.

In linear approximation calculation at a second or subsequent measurement time after the elapse of the specified time, a raw thickness value outside the range of the specified time from that measurement time is invalidated and is not used for line determination. This range setting is effective in coping with a time-rate change when, e.g., the etching rate changes over time during wet etching. A more accurate thickness change line and statistical thickness value can be obtained while ensuring a sufficient number of statistical points. However, if the change in etching rate poses no problem, raw thickness values from the initial measurement time may always be used. In this case, the number of statistical points of raw thickness value data to be used for statistical processing increases as time elapses.

In the wet etching apparatus shown in FIG. 1 and wet etching method using the above-described thickness measuring apparatus, on the basis of the thickness change line and statistical thickness value obtained by the statistical thickness value calculating section 16c, the end of wet etching by stopping supply of the etchant from the etchant supply section 24 or the change of the etching rate can be appropriately controlled through the etching control section 25. Especially, for the thickness of the semiconductor wafer obtained after the end of wet etching, the variation from the terminal thickness can be suppressed by obtaining the end time on the basis of the thickness change line and statistical thickness value, and the preset terminal thickness. Hence, the efficiency and yield in semiconductor manufacturing can be increased.

More specifically, in the above example, when the calculated statistical thickness value is equal to or less than the terminal thickness, the measurement time is set as the end time. In addition, an end instruction signal is output from the thickness calculating section 16 (statistical thickness value calculating section 16c) to the etching control section 25, thereby ending wet etching.

Other than the above example, an arrangement for predicting the end time using the thickness change line can be employed. That is, as shown in FIG. 9, the thickness change line $FTh_{tm}(t)$ is extrapolated (extended), and an intersection between the thickness change line and a line that indicates the terminal thickness is obtained. A time te at that intersection can be predicted as the end time. When the end time is predicted in advance, wet etching end control can be performed on the basis of the predicted end time.

For example, there is a time lag to some extent after supply of the etchant from the etchant supply section 24 is stopped by the end instruction signal until the etchant on the etching surface is removed by cleaning water. For this reason, in the control method of setting, as the end time, the time when the thickness becomes equal to or smaller than the terminal thickness, overetching may occur. To the contrary, when an end time predicted in advance on the basis of a thickness change line is used, and supply of the etchant is stopped at a time earlier than the end time by the time lag, no overetching occurs. Hence, the terminal thickness of the semiconductor wafer W can be accurately controlled.

The thickness measuring apparatus and thickness measuring method according to the present invention, and the wet etching apparatus and wet etching method using the thickness measuring apparatus and method are not limited to the above-described embodiment, and many changes and modifications of the arrangement or process can be made. For example, the holding substrate 21 maintains the mechanical strength of the semiconductor wafer W to be etched thin. Some semiconductor wafers W can be etched without using the holding substrate 21 depending on their thicknesses.

In the above embodiment, the probe head 13 serving as a light output means is also used as a light input means for receiving reflected light from the semiconductor wafer W. However, a light input means may be arranged separately from the light output means. In this case, since the reflected light is input to an optical fiber different from the optical fiber 13a to the probe head 13, the reflected light and reference light are coupled using, e.g. another optical coupler arranged in addition to the optical coupler 12. Alternatively, only one of the light input/output means or the light branching/coupling means may be formed from a single light input/output means or optical coupler, and the other means may be formed from separate means.

The etching rate of wet etching need not always be constant. For example, when etching is controlled such that the etching rate becomes low near the terminal thickness (etching end time) on the basis of the time-rate change in thickness of the semiconductor wafer W obtained by thickness measurement, the thickness can more finely be controlled. In this case, the time range of raw thickness data in which a time-rate change in thickness is obtained may be divided, and thickness change lines may be separately obtained before and after an etching rate change time.

For each calculation of statistical processing for calculating the thickness change line and statistical thickness value, various changes and modifications other than the above-described embodiment can be made. For example, for data sorting calculation executed at the first measurement time after the elapse of the specified time before determination of the thickness change line, data sorting is executed twice in the above embodiment. This data sorting may be executed only once or three or more times.

INDUSTRIAL APPLICABILITY

The thickness measuring apparatus and thickness measuring method according to the present invention and the wet etching apparatus and wet etching method using the thickness measuring apparatus and method can be used as a thickness measuring apparatus and method and the like capable of measuring the thickness of a semiconductor wafer independently of the presence of an etchant and obtaining a statistical thickness value in which the influence of an error variation and statistical variation is sufficiently reduced by calculating the raw thickness value of the semiconductor wafer W from the optical path length difference between two light intensity peaks selected from the light intensity distribution of interference light obtained by coupling reflected light and reference light and executing statistical processing including determination about the allowable numerical value range and determination of the thickness change line and, more particularly, at the first measurement time after the elapse of the specified time, statistical processing including data sorting calculation and determination of the thickness change line.

When such thickness measurement is used, the actual etching rate or a time-rate change in etching rate in each wet etching process can be known by actual measurement. Hence, instead of determining at the inspection stage for measuring the thickness of the resultant semiconductor wafer after the end of wet etching whether wet etching has been satisfactorily executed, wet etching can be controlled while determining a time-rate change in thickness during etching. Hence, the efficiency and yield in semiconductor manufacturing can be increased.

What is claimed is:

1. A thickness measuring apparatus for measuring a thickness of a semiconductor wafer during excution of wet etching using an etchant, characterized by comprising:

a measurement light source which supplies measurement light at each of a plurality of measurement times at a predetermined time interval;

light branching means for branching the measurement light from said measurement light source;

light output means for outputting one componet of the measurement light branched by said light branching means to the semiconductor wafer as a measurement object so as to irradiate the semiconductor wafer from a side of an etching surface to which the etchant is being supplied;

light input means for inputting reflected light obtained when the measurement light irradiated from said light output means is reflected by the etchant or semiconductor wafer;

reference light generating means for passing the other component of the measurement light branched by said light branching means through a reference optical path designed to be able to change an optical path length so as to generate reference light for which a reference optical path length is set;

light coupling means for obtaing interference light by coupling the reflected light from said light input means to the reference light from said reference light generating means;

photodetection means for detecting the interface light from said light coupling means;

raw thickness value calculating means for calculating a raw thickness value of the semiconductor wafer on the basis of an optical path length difference in reference optical path length between two light insensity peaks selected from a plurality of light insensity peaks each having a light insensity more than a set threshold value, using a light insensity disturbution representing a correlation between the reference optical path length set by said reference light generating means and a light insensity of the interface light detected by said photodetection means at each of the measurement times; and statistical thickness value calculating means for, at each of the measurement times after an elaspe of a specified time from a initial measurement time, determing a thickness change line by linear approximixation for a time-rate change in a plurality of valid raw thickness values within a set allowable numerical value range so as to calculate a statistical thickness value from the thickness change line, wherein at the first measurement time after the elaspe of the specified time from the initial measurement time, said statistical thickness value calculating means excutes, for the time-rate change in valid raw thickness value before the measurement time, data sorting calculation including determination of a thickness change line for sorting by linear approximation, setting of a sorting numerical value range for the thickness change line for sorting, and sorting of data for which the raw thickness value outside the sorting numerical value range is to be invalidated, then determines the thickness change line by linear approximation for the time-rate change in valid raw thickness value after sorting, and sets the allowable numerical value range from the thickness change line.

2. A thickness measuring apparatus according to claim 1, characterized in that at each of the second and subsequent measurement times after the elapse of the specified time for the initial measurement time, said statistical thickness value calculating means determines on the basis of whether the raw thickness value calculated at the measurement time falls within or outside a range of the allowable numerical value range from the the thickness change line determined at the preceding measurement time whether the raw thickness value is valid or invalid, when the raw thickness value falls within the allowable numerical value range and is regarded as valid, determines the thickness change line by linear approximation for the time-rate change in the plurality of valid raw thickness values including the raw thickness value and calculates the statistical thickness value from the thickness change line, and when the raw thickness value falls outside the allowable numerical value range and is regarded as invalid, determines the thickness change line determined at preceding measurement time as the thickness change line at the current time and calculates the statistical thickness value from the thickness change line.

3. A thickness measuring apparutus according to claim 1, characterized in that at the first measurement time after the elapse of the specified time from the initial measurement time, said statistical thickness value calculating means sets the allowable numerical value range to a numerical value range narrower than the sorting numerical value range.

4. A thickness measuring apparatus according to claim 1, characterized in that at the first measurement time after the elapse of the specified time from the initial measurement time, said statistical thickness value calculating means sets the sorting numerical value range on the basis of a variation value of the raw thickness value to be sorted from the thickness change line for sorting and a predetermined sorting constant, and sets the allowable numerical value range on the basis of a variation value of the valid raw thickness value after sorting from the thickness change line and a predetermined allowance constant.

5. A thickness measuring apparatus according to claim 1, characterized in that said statistical thickness value calculating means invalidates the raw thickness value when the number of light intensity peaks is less than three at each of the measurement times.

6. A thickness measuring apparatus according to claim 1, characterized in that at each of the second and subsequent measurement times after the elapse of the specified time from the initial measurement time, said statistical thickness value calculating means invalidates the raw thickness value outside the range of the specified time from the measurement time.

7. A wet etching apparatus having said thickness measuring apparatus of claim 1, characterized by comprising:

etchant supply means for supply the etchant to the etching surface of the semiconductor wafer as an object of wet etching; and etching control means for conducting supply of the etchant by said etchant supply means.

8. a wet etching apparatus according to claim 7, characterized in that said statistical thickness value calculating means of said thickness measuring apparatus obtains an end time of wet etching on the basis of terminal thickness preset from the determined thickness change line and outputs an end instruction signal to instruct the end time, and said etching control means causes said etchant suply means to stop supply of the etchant on the basis of the end instruction signal.

9. A thickness measuring method of measuring a thickness of a semiconductor wafer during excution of wet etching using am etchant, characterized by comprising:

the measurement light supply step supplying measurement light from a measurement light source at each of a plurality of measurement times at a predetermined time interval;

the light branching step of branching the measurement light from the measurement light source;

the light output step of outputting one componet of the measurement light branched in the light branching step to the semiconductor wafer as a measurement object so as to irradiate the semiconductor wafer from a side of an etching surface to which the etchant is being supplied;

the light input step of inputting reflected light obtained when the measurement light irradiate in the light output step is reflected by the etchant or semiconductor wafer;

reference light generating step of passing the other component of the measurement light branched in the light branching step through a reference optical path designed to able to change an optical path length so as to generate reference light for which a reference optical path length is set;

the light coupling step of obtaing interference light by coupling the reflected light input in the light input step to the reference light generated in the reference light generating step;

the photodetection step of detecting the interference light coupled in the light coupling step;

the raw thickness value calculating step of calculating a raw thickness value of the semiconductor wafer on the basis of an optical path length difference in reference optical path length between two light insensity peaks selected from a plurality of light insensity peaks each having a light insensity more than a set threshold value, using a light intensity distribution representing a correlation between the reference optical path lenght set in the reference light generating step and a light intensity of the interference light detected in the photodetection step at each of the measurement times; and the statistical thickness value calculating step of, at each of the measurement times after an elapse of a specified time for a initial measurement time, determining a thickness change line by linear approximation for a time-rate change in plurality of valid raw thickness values within a set allowable numerical value range so as to calculate a statistical thickness value from the thickness change line, wherein in the first measurement thickness value calculating step, at the first measurement time after the elapse of the specified time from the initial measurement time, for the time-rate change in valid raw thickness value before the measurement time, data sorting calculation including determination of a thickness change line for sorting by linear approximation, setting of a sorting numerical value range for the thickness change line for sorting, and sorting of data for which the raw thickness value outside the sorting numerical value range is to be invalidated is excuted, then the thickness change line by linear approximation is determined for the time-rate change in valid raw thickness value after sorting, and the allowable numerical value from the thickness change line is set.

10. A thickness measuring method according to claim 9, characterized in that in the statistical thickness value calculating step, at each of the second and subsequent measurement times after the elaspe of the specified time from the initial measurement time, it is determined on the basis of whether the raw thickness value calculated at the measurement time falls within or outside a range of the allowable numerical value range from the thickness change line determined at the preceding measurement time whether the raw thickness value is valid is valid or invalid, when the raw thickness value falls within the allowable numerical value range and is regarded as valid, the thickness change line by linear appromixation is determined for the time-rate change in the plurality of valid raw thickness values including the raw thickness value, and the statistical thickness value is calculated from the thickness change line, and when the raw thickness value falls outside the allowable numerical value range and is regarded as invalid, the thickness change line determined at the preceding measurement time is determined as the thickness change line at the current time, and the statistical thickness value is calculated from the thickness change line.

11. A thickness measuring method according to claim 9, characterized in that in the statistical thickness value calculating step, at the first measurement time after the elapse of the specified time from the initial measurement time, the allowable numerical value range is set to a numerical value range narrower than the sorting numerical value range.

12. A thickness measuring method according to claim 9, characterized in that in the statistical thickness value calculating step, at the first measurement time after the elapse of the specified time from the initial measurement time, the sorting numerical value range is set on the basis of a variation value of the raw thickness value to be sorted from the thickness change line for sorting and a predetermined sorting constant, and the allowable numerical value range is set on the basis of a variation value of the valid raw thickness value after sorting from the thickness change line and a predetermined allowance constant.

13. A thickness measuring method according to claim 9, characterized in that in the statistical thickness value calculating step, the raw thickness value is invalidated when the number of light intensity peaks is less than three at each of the measurement times.

14. A thickness measuring method according to claim 9, characterized in that in the statistical thickness value calculating step, at each of the second and subsequent measurement times after the elapse of the specified time from the initial measurement time, the raw thickness value outside the range of the specified time from the measurement time is invalidated.

15. A wet etching method including the thickness measuring method of claim 9, characterized by comprising:

the etching start step of supplying the etchant to the etching surface of the semiconductor wafer as an object of wet etching so as to start wet etching;

the thickness measuring step of measuring a thickness of the semiconductor wafer by the thickness measuring method during execution of wet etching started in the etching start step at each of the measurement times at the time interval; and the etching ending step of stopping supply of the etchant to end wet etching.

16. A wet etching method according to claim 15, characterized by further comprising the end time calculating step of obtaining an end time of wet etching on the basis of a terminal thickness preset from the thickness change line determined in the thickness measuring step, and wherein in the etching ending step, supply of the etchant is stopped on the basis of the end time obtained in the end time calculating step.

17. A wet etching method according to claim 16, characterized in that in the end time calculating step, the measurement time when the statistical thickness value calculated from the thickness change line is not more than the terminal thickness is obtained as the end time.

18. A wet etching method according to claim 16, characterized in that in the end time calculating step, the end time is predicted using the thickness change line.

* * * * *